United States Patent
Wong

(10) Patent No.: US 9,754,861 B2
(45) Date of Patent: Sep. 5, 2017

(54) PATTERNED LEAD FRAME

(71) Applicant: STMicroelectronics Pte Ltd, Singapore (SG)

(72) Inventor: Wing Shenq Wong, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 12 days.

(21) Appl. No.: 14/512,208

(22) Filed: Oct. 10, 2014

(65) Prior Publication Data

US 2016/0104663 A1  Apr. 14, 2016

(51) Int. Cl.
*H01L 23/495* (2006.01)

(52) U.S. Cl.
CPC .. *H01L 23/49503* (2013.01); *H01L 23/49541* (2013.01); *H01L 23/49551* (2013.01); *H01L 2224/32245* (2013.01); *H01L 2224/48091* (2013.01); *H01L 2224/48247* (2013.01); *H01L 2224/73265* (2013.01); *H01L 2224/83385* (2013.01); *H01L 2924/181* (2013.01)

(58) Field of Classification Search
CPC ........... H01L 23/4951; H01L 23/49548; H01L 23/28–23/3192
See application file for complete search history.

(56) References Cited

U.S. PATENT DOCUMENTS

| | | | |
|---|---|---|---|
| 4,195,193 A | 3/1980 | Grabbe et al. | |
| 5,032,438 A * | 7/1991 | Sakumoto | C09J 7/02 156/247 |
| 5,168,368 A * | 12/1992 | Gow, 3rd | H01L 23/49517 257/666 |
| 5,521,428 A * | 5/1996 | Hollingsworth | H01L 23/49503 257/669 |
| 5,914,528 A | 6/1999 | Takiar et al. | |
| 6,281,568 B1 * | 8/2001 | Glenn | H01L 23/3107 257/666 |
| 8,310,060 B1 | 11/2012 | Nondhasittichai et al. | |
| 8,383,962 B2 | 2/2013 | Sutardja | |
| 2003/0168719 A1 * | 9/2003 | Cheng | H01L 23/3107 257/666 |
| 2004/0061205 A1 * | 4/2004 | Han | H01L 23/49503 257/666 |
| 2004/0070056 A1 * | 4/2004 | Matsuzawa | H01L 21/4828 257/666 |
| 2006/0186528 A1 * | 8/2006 | Sasaki | H01L 23/49513 257/690 |
| 2007/0278633 A1 * | 12/2007 | Uematsu | H01L 21/4828 257/676 |
| 2009/0209064 A1 * | 8/2009 | Nonahasitthichai | H01L 21/561 438/110 |
| 2009/0236706 A1 * | 9/2009 | Chen | H01L 23/4334 257/675 |

(Continued)

FOREIGN PATENT DOCUMENTS

JP  06252328 A * 9/1994 ............. H01L 23/50

*Primary Examiner* — Joshua King
(74) *Attorney, Agent, or Firm* — Seed IP Law Group LLP

(57) ABSTRACT

A lead frame having a plurality of concentric lead frame rings configured to receive and support a variety of integrated circuit die having a variety of sizes. The rings are separated from each other by gaps and coupled together by a plurality of tie bars. The concentric rings may be circular or rectangular. The tie bars may extend diagonally from the rings or perpendicularly to the rings.

16 Claims, 14 Drawing Sheets

(56) References Cited

U.S. PATENT DOCUMENTS

2010/0259908 A1* 10/2010 Sutardja ................ H01L 21/50
361/760
2011/0089547 A1* 4/2011 Holloway ............. H01L 21/568
257/676

* cited by examiner

PATTERNED LEAD FRAME

BACKGROUND

Technical Field

The present application relates to packaging of a semiconductor die and more particularly, to ring or coil patterned die pads of lead frames packages.

Description of the Related Art

Integrated circuits are formed from semiconductor dice that have been processed to form electronic circuitry. Before integrated circuits are put into commercial application, they are generally packaged in such a way to protect the semiconductor die. Integrated circuits are packaged in a variety of ways. A particularly common type of integrated circuit package is the lead frame.

FIGS. 1A and 1B are views of a known type of integrated circuit package 19. FIG. 1A is a top view of the integrated circuit package 19 including a lead frame 10. The frame includes a central die pad 12, tie bars 14, and wire bond leads 16. The dashed box denotes an integrated circuit die 18 positioned on the lead frame 10.

FIG. 1B is a cross-sectional view of the integrated circuit package 19 taken on cross-section lines 1B of FIG. 1A. The integrated circuit package 19 includes the integrated circuit die 18 positioned on the die pad 12 of the lead frame 10. The integrated circuit die 18 is coupled to the die pad by adhesive paste 24.

Molding compound 20 encapsulates the integrated circuit die 18 and the die pad 12. Bonding wires 22 electrically couple the wire bond leads 16 to the integrated circuit die 18.

It is common that a die pad of a lead frame is tooled to have a particular size relative to the integrated circuit die which will be placed thereon. This is because as a ratio of the die pad area to the integrated circuit die area increases, the likelihood of delamination of the molding compound from the lead frame also increases. If the molding compound becomes delaminated from the lead frame, the integrated circuit die within the package is at risk of being damaged. In particular, when the molding compound becomes delaminated from the die pad, moisture can seep into the integrated circuit package causing damage to the integrated circuit die or short-circuiting the bonding wires. If this happens, the integrated circuit die may function poorly or may cease functioning altogether. Furthermore, when delamination of the molding compound occurs, the integrated circuit die is more susceptible to damage from being bumped or jostled because the integrated circuit die is no longer fixed in place as securely as before delamination occurred.

Thus, great expense is incurred to tool a variety of lead frame die pad sizes to fit particular integrated circuit dies, even if the final packages are all the same size. To overcome this problem attempts have been made to include regular edge patterns for the die pad and dimples in the die pad in order to promote better adhesion of the molding compound to the die. However, these solutions have worked poorly and can be cost prohibitive.

BRIEF SUMMARY

One embodiment of the present disclosure is a lead frame including a plurality of concentric rings instead of a typical die pad. Each concentric ring has a fixed gap between itself and adjacent rings. The integrated circuit die is placed on the concentric rings. A smaller integrated circuit die will be positioned on a fewer number of the concentric rings as compared to a larger die. In this way, a single lead frame will adequately support several different integrated circuit dies of varying sizes. Furthermore, the molding compound attaches better by filling the gaps between the concentric rings and interlocking with the concentric rings in a secure fashion. The concentric rings are fixed to each other by one or more tie bars that are coupled to each of the concentric rings.

In one embodiment there is no central pad on which the die rests, but instead there is a void in the lead frame below a center position of the die. An adhesive tape or film placed over the concentric rings adheres the integrated circuit die to the concentric rings. One embodiment is directed to a method for forming a lead frame.

The method includes stamping or etching a central die pad of a stock lead frame to a series of concentric rings. The concentric rings can be in the shape of concentric rectangular frames, concentric circular frames, or concentric ovular frames. A single pattern can be used for a large variety of integrated circuit die sizes. This greatly reduces tooling costs for lead frames while simultaneously improving the structural integrity of the integrated circuit die package.

DETAILED DESCRIPTION

Figure 1A:
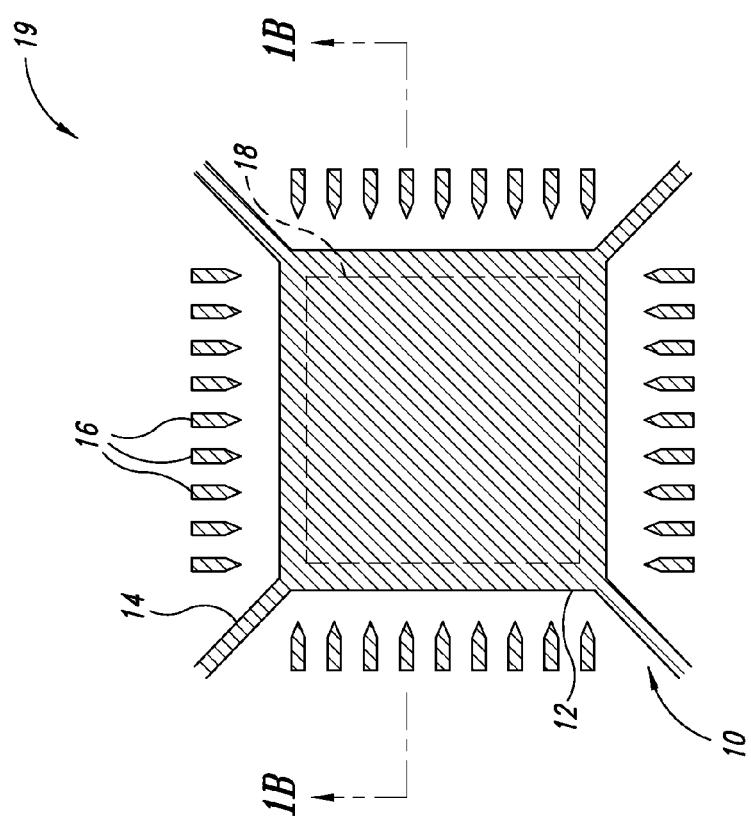
FIG. 1A is a top view of a known integrated circuit package.
Figure 1B:
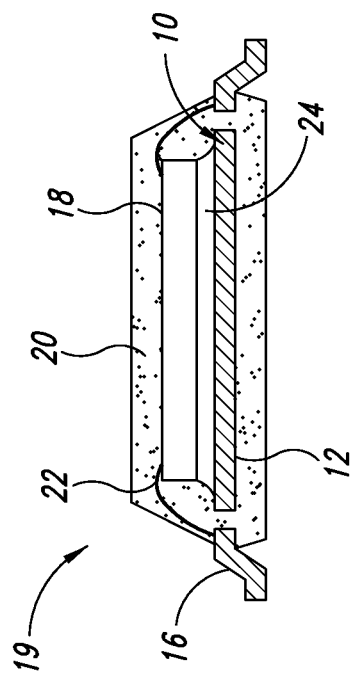
FIG. 1B is a cross-section of the integrated circuit package of FIG. 1A.
Figure 2A:
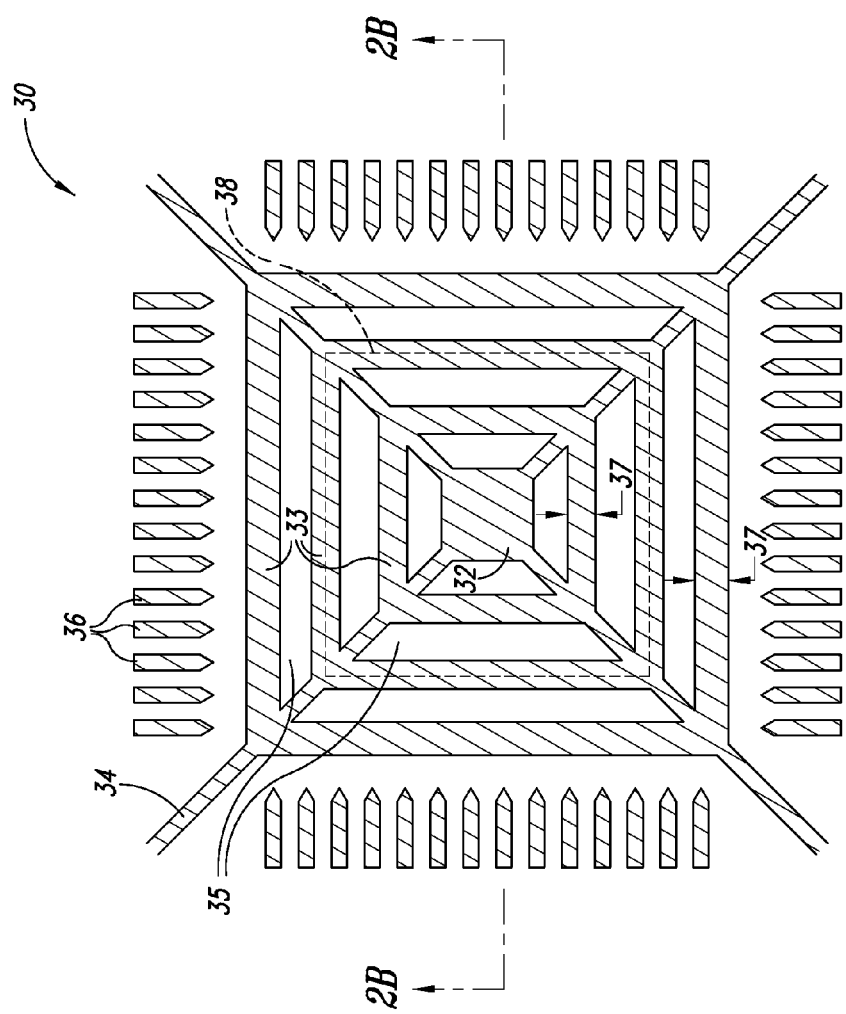
FIG. 2A is a top view of an integrated circuit package according to one embodiment.

FIG. 2A is a top view of a lead frame according to one embodiment. The lead frame 30 includes a central pad 32 and three concentric rings or frames 33 coupled together by tie bars 34. Wire bond leads 36 are positioned on the periphery of the lead frame 30. The dashed box indicates a position of an integrated circuit die 38 on the lead frame 30.

The rings 33 are positioned to allow the integrated circuit die to be supported without having an overly large ratio of a die pad area to an integrated circuit die area. In this situation, the die will overlap the central pad 32, the innermost concentric ring closest to the central pad 32, and a portion of the middle concentric ring 33. A surface area of the central pad 32, the innermost ring 33, and the portion of the middle concentric ring 33 is significantly less than a surface area of the die 38.

In the example in FIG. 2A, the integrated circuit die 38 has a size that causes it to be supported by the inner two rings 33 without resting on the outermost ring 33. If the integrated circuit die 38 was larger, it could rest on all of the rings, including the outermost ring 33. The first and second rings offer sufficient support to the integrated circuit die 38. Furthermore, gaps 35 between the rings 33 allow for increased interlocking between the molding compound (not pictured in FIG. 2A) and the lead frame 30. Thus, even if the integrated circuit die is small enough so that one or more of the rings 33 are not directly below the integrated circuit die 38, there is no increased risk of delamination of the molding compound due to the gaps between the rings which provide for greater interlocking with the molding compound.

The lead frame 30 of FIG. 2A reduces the die pad tooling cost because a single design and pattern can be used for several different integrated circuit packages each with different sized integrated circuit dies. This avoids having to design and tool multiple models of lead frames for the various integrated circuit die sizes. The wire bond leads 36 can also be used for the I/O of a large variety of integrated circuit dies.

The lead frame 30 can be formed by stamping or etching a ring or frame pattern onto a standard die pad mold. For die attach purposes, the rings 33 can have silver spot plating. Furthermore, the rings 33 can be used as ground or some other potential such as VDD in some cases. The rings also provide support to the die during wire bonding processes, counteracting ring vibration in the die attach film during wire bonding.

The lead frame 30 can be manufactured from copper, aluminum, gold, steel, or any other suitable material. If steel, it may be preplated with nickel palladium. It is preferable that the material of the lead frame 30 be conductive. Thus, copper is a common choice for lead frames.

The rings 33 can be any shape such as circular, square, rectangular, oval, etc. The tie bars 34 can also be in any position. In the example of FIG. 2A, the tie bars 34 extend through the corners of the lead frame 30 at a diagonal. FIG. 2A shows four tie bars 34. However, more or fewer than four tie bars can be used as will be apparent to those of skill the art in light of the present disclosure. Nevertheless, it is preferable to have an even number of tie bars 34. It is also preferable that the tie bars 34 be symmetrical. In addition, the entire lead frame is symmetrical, which is beneficial to evenly address mechanical stresses.

In this embodiment, each ring 33 has a generally square shape where the tie bar 34 passes through a corner of the square. In addition, each ring 33 has a width 37. In this embodiment, each ring has the same width 37. In addition, each gap 35 is a same dimension.

Figure 2B:
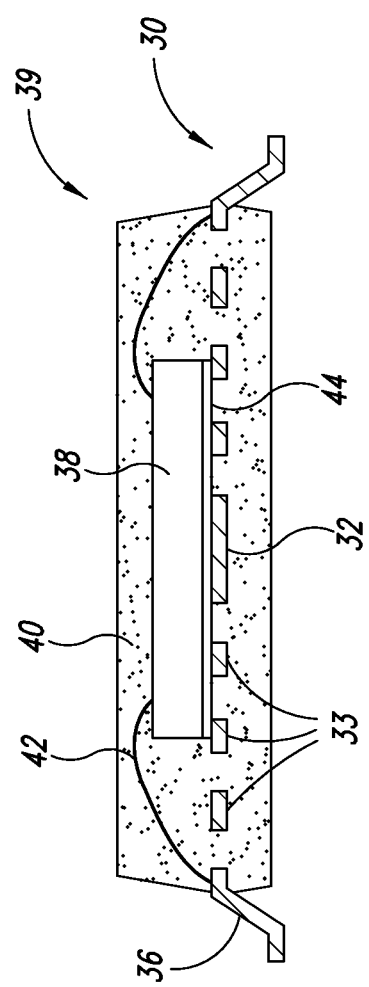
FIG. 2B is a cross-section of the integrated circuit package FIG. 2A.

FIG. 2B is a cross-section of the lead frame 30 of FIG. 2A encapsulated in a molding compound 40 to form an integrated circuit package 39. The integrated circuit package 39 includes the lead frame 30 having the concentric rings 33 and the central pad 32 in the middle of the lead frame 30. Bonding wires 42 extend from the wire bond leads 36 to contact pads on top of the integrated circuit die 38. Though not shown in FIG. 2B, one or more bonding wires 42 can also extend from one or more of the wire bond leads 36 to one or more of the concentric rings 33. The integrated circuit die 38 is attached to the concentric rings 33 by an adhesive material 44, such as tape. Is not preferable to use a glue or paste to attach the integrated circuit die 38 to the concentric rings 33 because the glue will flow into the gaps between the rings 33, causing problems with the functionality and security of the integrated circuit package 39.

Figure 3A:
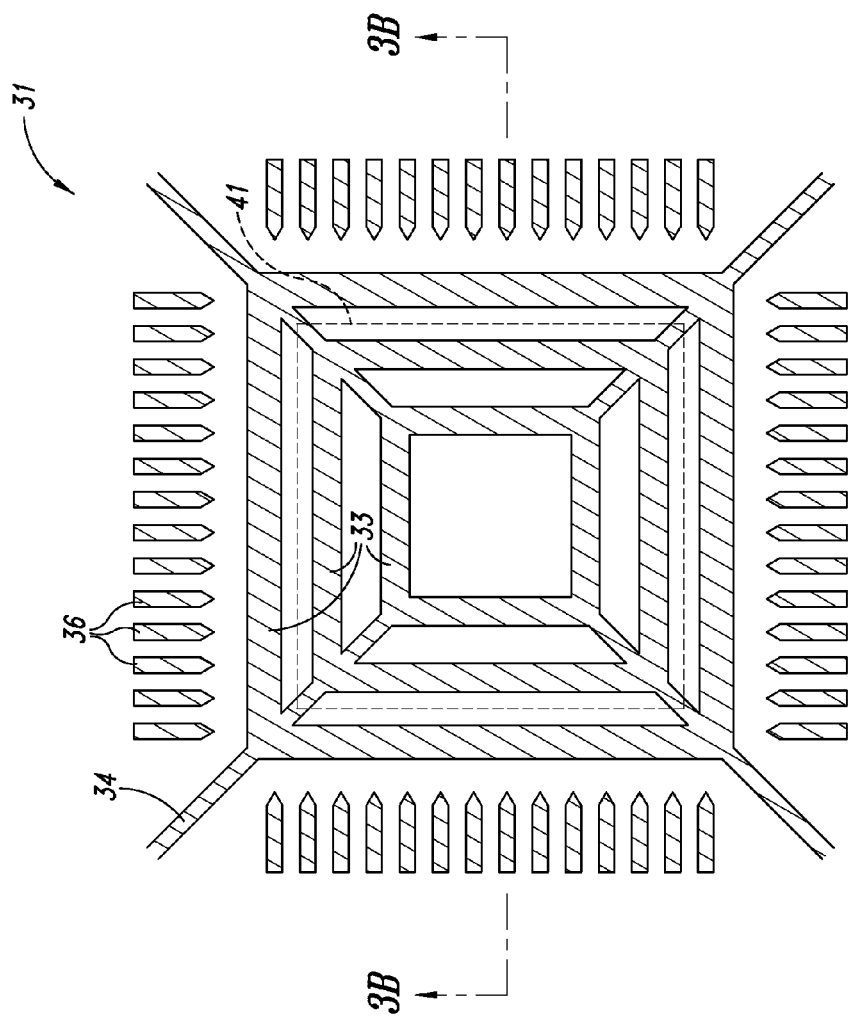
FIG. 3A is a top view of an integrated circuit package without a central die pad according to one embodiment.

FIG. 3A is a top view of a lead frame 31 according to one embodiment that is similar to the lead frame 30 of FIG. 2A. Similar features will be referred to by the same reference numbers. The lead frame 31 includes three concentric rings 33 coupled together by the tie bars 34. The wire bond leads 36 are positioned on the periphery of the lead frame. The dashed box indicates a position of an integrated circuit die 41 on the lead frame 31.

The lead frame 31 of FIG. 3A differs from the lead frame 31 of FIG. 2A in that a central pad 32 is not present at the center of the lead frame 31. Instead, an integrated circuit die 38 can be supported solely by the concentric rings 33 of the lead frame 31. The rings 33 are positioned to allow an integrated circuit die to be supported without having an overly large ratio of die pad area to integrated circuit die area.

In the example FIG. 3, integrated circuit die 38 has a size that causes it to be supported by the inner two rings 33 without resting on the outermost ring 33. It is not a problem that the edge of the integrated circuit die 38 is suspended over the gap between the second and third rings 33. The first and second rings offer sufficient support to the integrated circuit die 30.

As described above in relation to FIG. 2A, the lead frame 31 of FIG. 3A reduces the die pad tooling cost because a single design and pattern can be used for integrated circuit packages, which includes different sized integrated circuit dies. This avoids having to design and tool multiple models of lead frames for the various integrated circuit die sizes. The wire bond leads 36 can also be used for the I/O of a large variety of integrated circuit dies.

The lead frame 31 of FIG. 3A includes a gap at the center most position of the lead frame 31. This gap can be advantageous as it provides for increased adhesion of the molding compound with the integrated circuit die 38 and interlocking of the molding compound with the lead frame 31.

As described previously, the lead frame 31 of FIG. 3A can be formed by stamping or etching a ring or frame pattern onto a standard die pad mold. For die attach purposes, the rings 33 can have silver spot plating. Furthermore, the rings 33 can be used as ground or some other potential such as VDD in some cases. The rings also provide support to the die during wire bonding processes, counteracting ring vibration in the die attach film during wire bonding.

The lead frame 31 can be manufactured from copper, aluminum, gold or any other conductive material. It is preferable that the material of the lead frame 31 also be electrically conductive. Thus, copper is a common choice for lead frames.

The rings 33 can be any shape such as circular, square, rectangular, oval, etc. The tie bars 34 can also be in any position. In the example of FIG. 3A, the tie bars 34 extend through the corners of the lead frame 31 at a diagonal. FIG. 3A shows four tie bars 34. However, more or fewer than four tie bars can be used as will be apparent to those of skill the art in light of the present disclosure. Nevertheless, it is preferable to have an even number of tie bars 34. It is also preferable that the tie bars 34 be symmetrical.

Figure 3B:
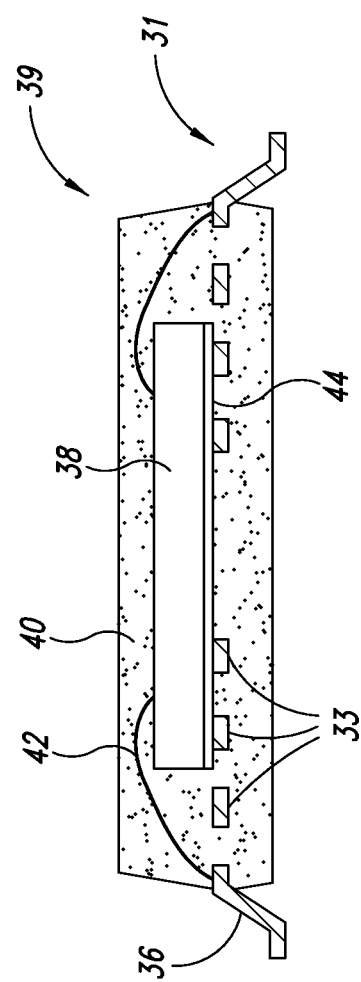
FIG. 3B is a cross-section of the integrated circuit package of FIG. 3A.

FIG. 3B is a cross-section of the lead frame 31 as shown in FIG. 3A encapsulated in an integrated circuit package 39. The integrated circuit package 39 includes the lead frame 31 having concentric rings 33 and a gap in the middle of the lead frame 31. The lead frame 31 and integrated circuit 38 are encapsulated in a molding compound 40. Bonding wires 42 extend from the wire bond leads 36 to contact pads on top of the integrated circuit die 38. Though not shown in FIG. 3B, one or more bonding wires 42 can also extend from one or more of the wire bond leads 36 to one or more of the concentric rings 33. The integrated circuit die 38 is attached to the concentric rings 33 by an adhesive tape 44. Is not preferable to use a glue or paste to attach the integrated circuit die 38 to the concentric rings 33 because the glue will flow into gaps between the rings 33, causing problems with the functionality and security of the integrated circuit package 39.

Figure 4:
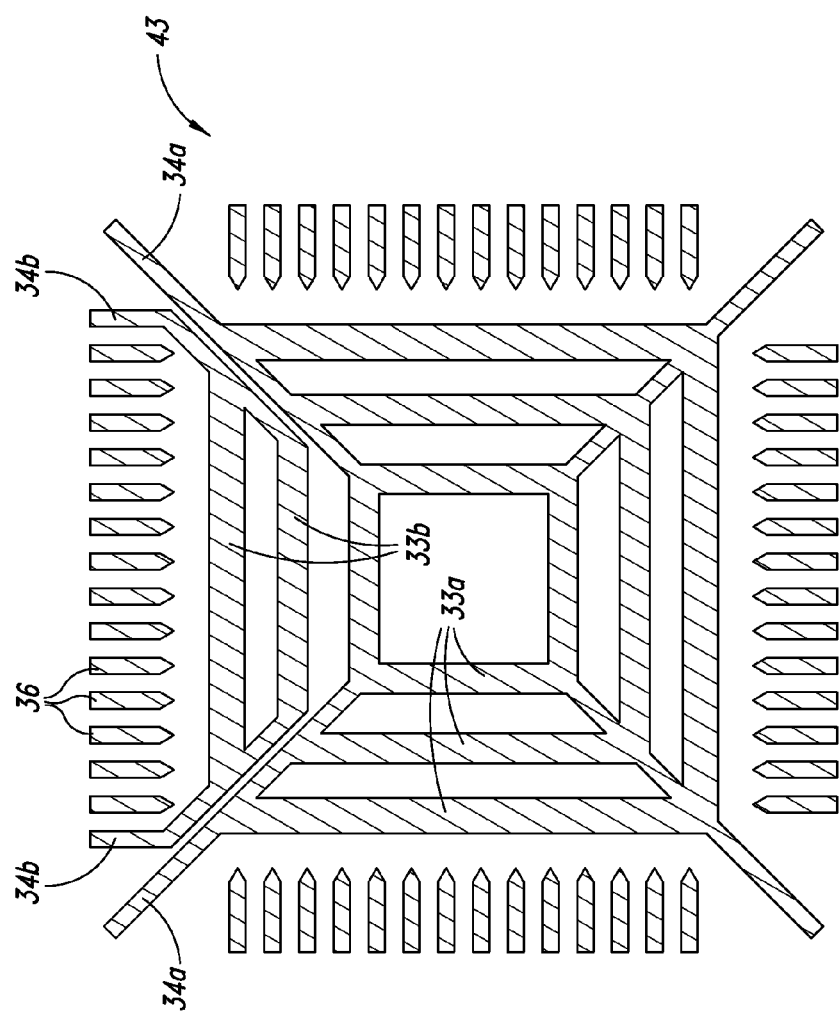
FIG. 4 is a top view of an integrated circuit package including a lead frame with electrically isolated portions according to one embodiment.

FIG. 4 is a top view of a lead frame 43 according to one embodiment. The lead frame 43 includes concentric rings similar to those of FIG. 3A. However, in FIG. 4 the concentric rings are divided into a first portion 33a and a second portion 33b. The first portion 33a of the concentric rings is electrically isolated from the second portion 33b of the concentric rings. In this way, the lead frame 43 can be supplied with two different supply voltages. For example, the first portion 33a can be supplied with ground voltage while the second portion 33b can be supplied with the high supply voltage VDD. The first portion 33a includes four tie bars 34a similar to those disclosed with respect to FIG. 3A. The tie bars 34a are coupled to the concentric rings 33a and fix the concentric rings 33a in place. The tie bars 34a are not coupled to the second portion 33b of the concentric rings. Instead, tie bars 34b are coupled to the second portion 33b of the concentric rings. Thus, the first and second portions 33a, 33b are coupled to the respective tie bars 34a, 34b.

The tie bars 34b extend out to the periphery in line with the wire bond leads 36. In other embodiments, the tie bards 34b may extend parallel to the tie bars 34a. In another embodiment, the first portion 33a of the concentric rings may be broken into a third portion like the second portion 33b. For example, the third portion may be a mirror image of the second portion 33b, such that the second portion is in a top position, the third portion is in a bottom position, and the first portion has the right and left position.

Figure 5:
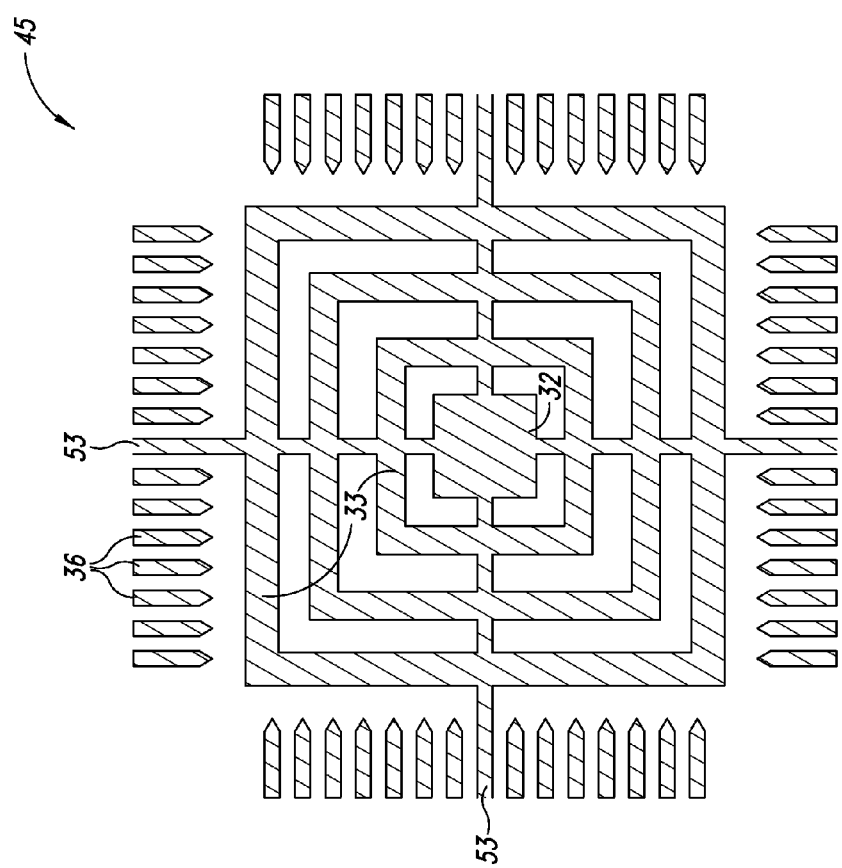
FIG. 5 is a top view of an integrated circuit package including tie bars that intersect concentric frames at 90° angles according to one embodiment.

FIG. 5 is a top view of a lead frame 45 according to a further embodiment. The lead frame 45 of FIG. 5 is similar to the lead frame 30 of FIG. 2A. For example, the lead frame 45 includes a central pad 32 and concentric rings 33, where each ring 33 has a same or similar width. The lead frame 45 of FIG. 5 differs from the lead frame 30 of FIG. 2A in that tie bars 53 of FIG. 5 run perpendicular to sides of the concentric rings 33. This is different from tie bars 34 of FIG. 2A which run diagonally with respect to the concentric rings 33. The tie bars 53 extend out to a periphery and are aligned with the wire bond leads 36. The lead frame 45 of FIG. 5 is also configured to receive an integrated circuit die thereon and to be encapsulated in the integrated circuit package as described previously.

Figure 6A:
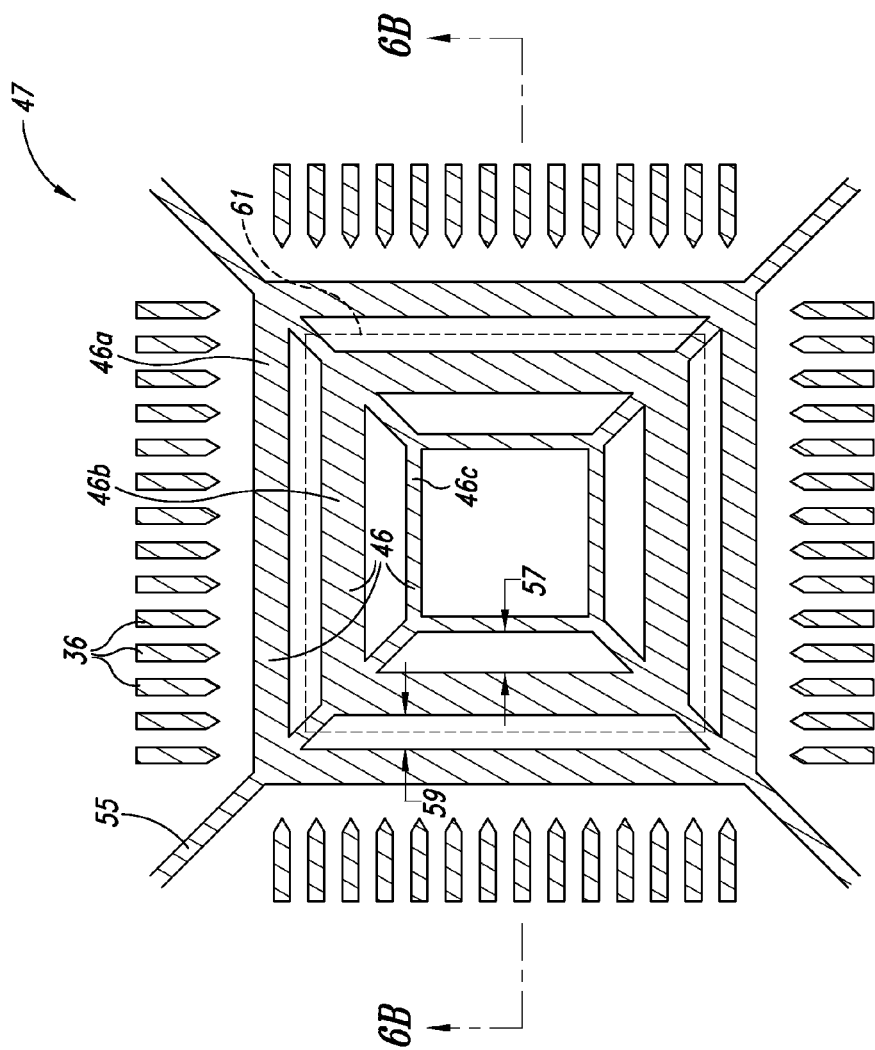
FIG. 6A is a top view of an integrated circuit package with different ring widths according to one embodiment.

FIG. 6A is a top view of a lead frame 47 for an integrated circuit package with a plurality of rings 46 where the rings have different ring widths according to one embodiment. The lead frame 47 has three concentric rings 46a, 46b, 46c coupled together with tie bars 55. The outer ring 46a has a first width; the middle ring 46b has a second width; and the inner ring 46c has a third width. In the embodiment shown in FIG. 6A, the first, second and third widths are dissimilar. In another embodiment, some of the rings may have a first similar width and others of the rings may have a second similar width, with the first and second similar widths being different. The distance between each of the rings may also vary.

In this embodiment, the lead frame 47 does not include a central pad and instead, a central area is free of any portion of the lead frame. In other embodiments, the lead frame 47 may include a central pad.

In this embodiment, the inner ring 46c has the smallest width. The middle ring 46b has the largest width and the outermost ring 46a has a width that is between the smallest and largest width. The inner ring 46c is spaced from the middle ring 46b by a first distance 57. The middle ring 46b is spaced from the outer ring 46a by a second distance 59. The first distance is larger than the second distance. This arrangement allows for a variety of medium sized die, medium with respect to this lead frame, to be utilized on this frame 47. In addition, spaces between the rings provide a large surface area at a center of a die 61 that can be supported by encapsulant 40, see FIG. 6B. The tie bars 55 can also extend from the rings perpendicularly as opposed to through corners of the parallelogram shaped rings.

Figure 6B:
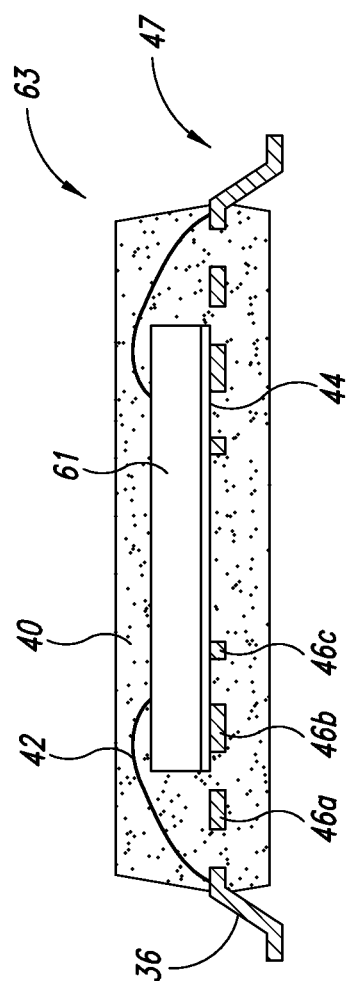
FIG. 6B is a cross-section of the integrated circuit package of FIG. 6A.

FIG. 6B is a cross-section of the integrated circuit package 63 of FIG. 6A. The inner ring 46c and middle ring 46b support the integrated circuit die 61 and an adhesive material 44, such as tape. Additionally, a first side of each ring may be wholly or partly coupled to the integrated circuit die 38 by the adhesive tape 44 depending on the size of the integrated circuit die 38.

The encapsulant 40 surrounds the die 61 and wires 42, which are coupled between the die 61 and the leads 36. The encapsulant 40 is coupled to the adhesive material 44 in a central area and between each of the rings that are below the die 61.

Figure 7:
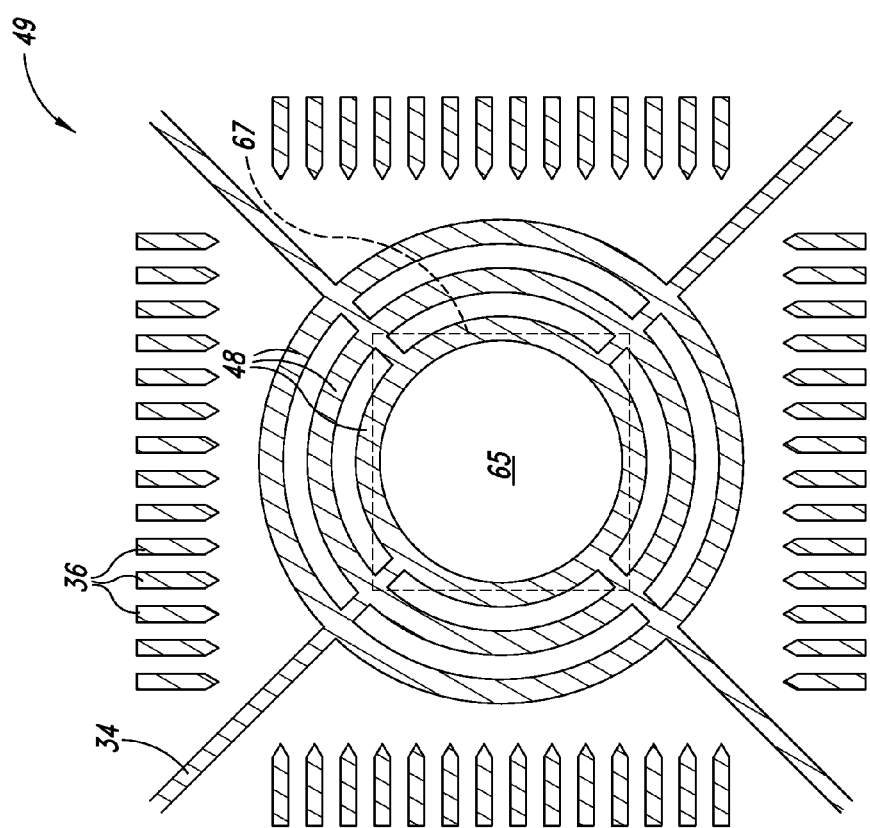
FIG. 7 is a top view of an integrated circuit package with curved rings according to one embodiment.

FIG. 7 is a top view of a lead frame 49 for an integrated circuit package with curved rings 48 according to one embodiment. The lead frame 49 includes three concentric rings 48. In one embodiment, the rings 48 may be circular or oval in shape. As discussed previously with respect to FIG. 6A, the rings may have equal or different widths. Also, the lead frame 49 may have more or less than three rings 48.

The lead frame 49 includes four tie bars or support bars 34 that extend from the innermost ring 48 past the outermost ring. The support bars 34 do not extend into a central area 65. The support bars 34 extend diagonally to corners of the lead frame 49. There is a plurality of wire bond leads 36 at a periphery of the lead frame. The wire bond leads 36 may be coupled to a die 67 (shown in dashed lines) prior to sealing the package with encapsulant The die 67 is relatively small for this lead frame in that the die overlaps the innermost ring. Alternative size dies can also be used with this lead frame. Additional rings may also be included.

Figure 8:
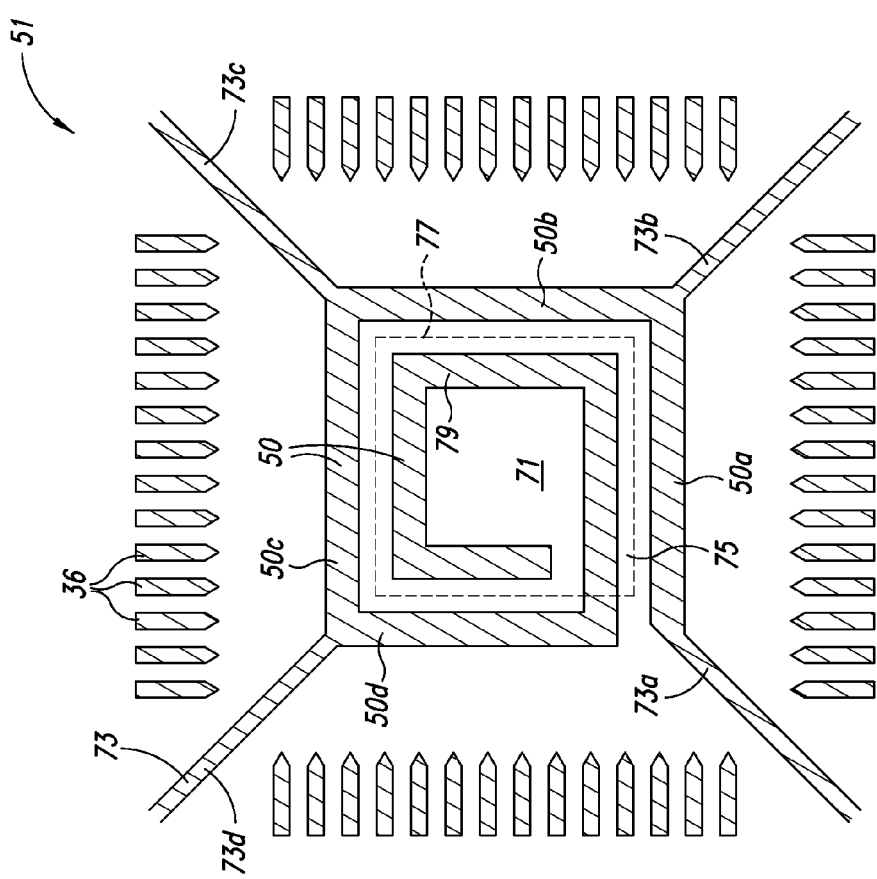
FIG. 8 is a top view of an integrated circuit package with a spiral die pad according to one embodiment.

FIG. 8 is a top view of a lead frame 51 for an integrated circuit package with a coil 50 according to one embodiment. The coil 50 has a plurality of branches that spiral towards a center 71 of the lead frame 51. The coil 50 may be supported by tie bars 73 only on an outermost spiral or may be coupled to tie bars 73 on multiple branches of the coil 50. The coil 50 is generally rectangular in shape in this embodiment; however, the coil may be circular or otherwise curved.

The coil 50 may have a constant or variable width in each spiral or in relation to other spirals. In addition, gaps 75 between each spiral of the coil 50 may be constant or variable. The coil 50 may extend from an outer position to the center position in lead frame 51 or may terminate prior to reaching the center position of the lead frame 51.

An integrated circuit die 77 may be any number of sizes. In one embodiment, the integrated circuit die 77 is sized so that the die overlays only an inner spiral 79 of the coil 50. In another embodiment, the integrated circuit die is sized such that it overlays the entirety of the coil 50.

In this embodiment, the center 71 remains free of the lead frame 51. However, in other embodiments, there may be a die pad in the center 71 or the coil 50 may continue further into the center. In this embodiment, a first one 73a of the tie bars 73 merges with a first branch 50a of the coil 50. A second one 73b of the tie bars 73 merges with a corner of the first branch 50a and a second branch 50b. A third one 73c of the tie bars merges with a corner of the second branch 50b and a third branch 50c. A fourth one 73d of the tie bars merges with a corner of the third branch 50c and a fourth branch 50d. The tie bars do not extend into the center and do not extend past the outermost branches of the coil. In other embodiments, the tie bars may extend into and support other corners of the inner branches of the coil.

Figure 9A:
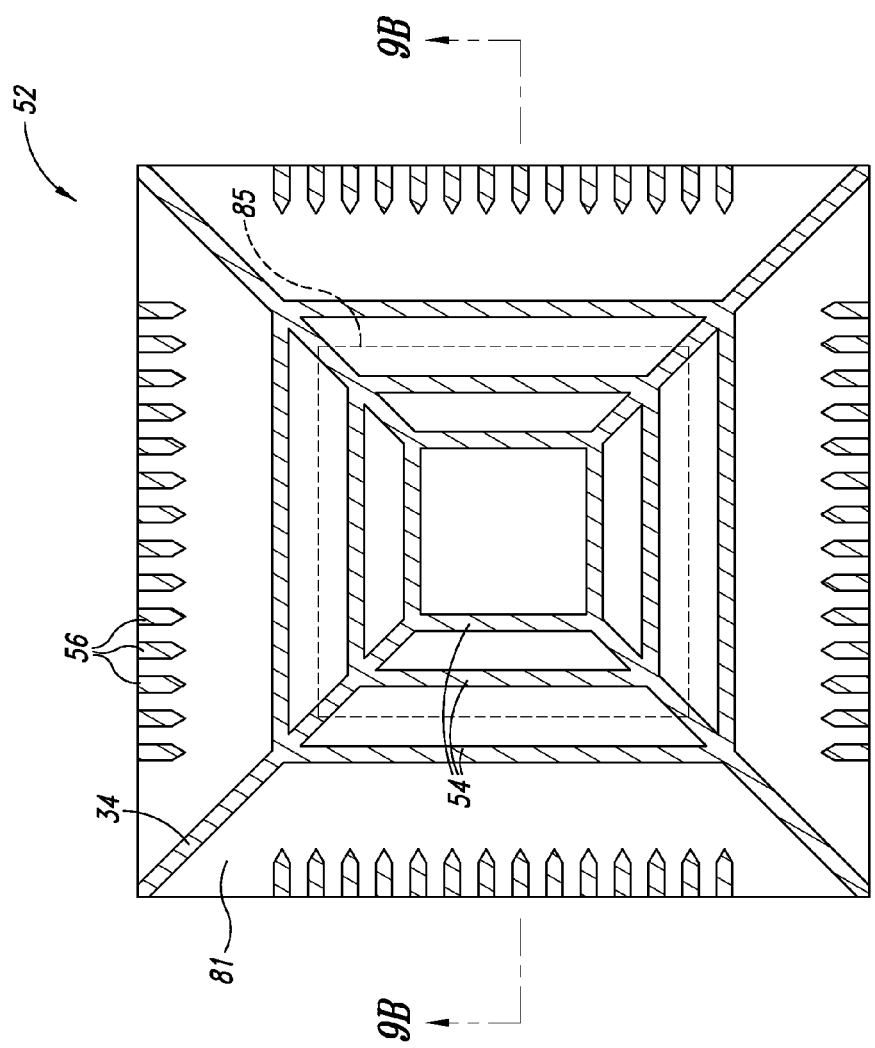
FIG. 9A is a top view of a quad flat no-lead (QFN) integrated circuit package according to one embodiment.
Figure 9B:
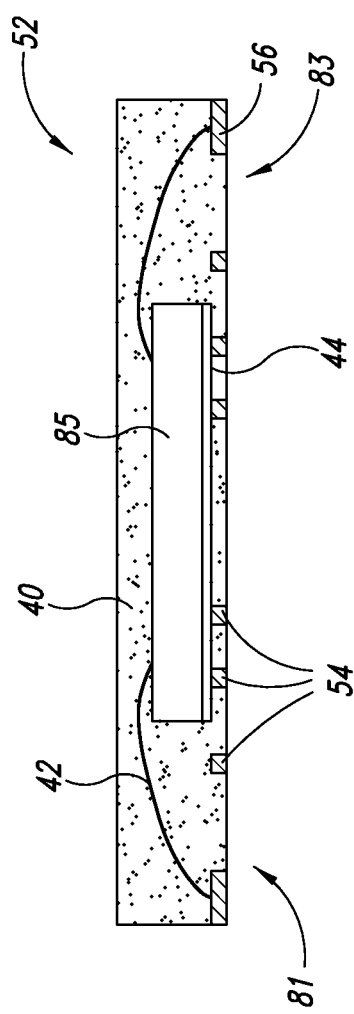
FIG. 9B is a cross-section of the integrated circuit package of FIG. 9A.

FIGS. 9A and 9B are a top view and cross-section view of a QFN integrated circuit package 52 according to one embodiment. The QFN package 52 includes a lead frame 81 formed in accordance with embodiments of the present disclosure. The QFN package 52 has contacts on a bottom side 83 that are exposed to the external environment. The contacts 56 can connect the integrated circuit package to an external device. The contacts 56 may also act as wire leads that couple to wires 42.

The QFN lead frame 52 includes a plurality of rings 54 that can support an integrated circuit die 85. The rings 54 are similar to the rings 33 described above. Notably, the rings 54 may vary both in shape and size.

The contacts 56 do not protrude beyond surrounding surfaces of the molding compound 40 in one embodiment. Additionally, the QFN lead frame 81 may or may not be exposed. An exposed QFN lead frame may or may not be coupled to an external signal.

The QFN integrated circuit package 52 includes the integrated circuit die 85 coupled to the QFN lead frame 81 by adhesive tape 44. The molding compound 40 encapsulates the QFN lead frame 81 and the integrated circuit die 85 at least in part in one embodiment.

In each embodiment, the tie bars are shown to be symmetrical. This can be beneficial to even distribution of stresses that affect the die. There may be more than 4 tie bars, such as tie bars that extend diagonally combined with tie bars that are perpendicular to the rings. In a preferred embodiment, there is an even number of tie bars to make the tie bars symmetrical.

These embodiments are beneficial because a single lead frame design can be utilized with a variety of different die. This will reduce manufacturing variability. This will use only on lead frame tooling, reducing tooling costs. This configuration also minimizes delamination risk, especially embodiments that do not include any portion of the lead frame in a center portion. There is also a greater adhesion with the lead frame, adhesive material, the die, and the encapsulant with openings between the features of the lead frame. The various rings support the die overhang during wire bonding.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a lead frame having a central area, including:
 a plurality of wire bond leads at a periphery of the lead frame;
 a plurality of concentric support frames positioned centrally with respect to the plurality of wire bond leads, the plurality of concentric support frames being separated from each other by a plurality of gaps; and
 a plurality of tie bars fixed to and extending from the plurality of support frames towards the periphery, the plurality of concentric support frames being electrically coupled to each other by the plurality of tie bars;
an adhesive tape positioned on the lead frame, the adhesive tape overlapping the central area and at least one gap of the plurality of gaps;
a die positioned on the adhesive tape, the die overlapping the central area and at least one of the plurality of concentric support frames, at least one of the plurality of concentric support frames being positioned between the die and the plurality of wire bond leads; and
a molding compound encapsulating the die, a portion of the molding compound filling the at east one gap, the portion of the molding compound filling the at least one gap being in contact with the adhesive tape.

2. The device of claim 1 wherein the support frames have a rectangular shape.

3. The device of claim 1 wherein the support frames have a circular shape.

4. The device of claim 1 wherein the plurality of support frames are rectangular and the plurality of tie bars extend from each corner of each rectangular support frame.

5. The device of claim 1 wherein the plurality of support frames are rectangular and the plurality of tie bars extend from each side of each rectangular support frame.

6. The device of claim 5 wherein each tie bar extends perpendicularly from each support frame.

7. The device of claim 1 wherein each support frame is separated from an adjacent support frame by a same distance.

8. The device of claim 1 wherein the plurality of support frames include a first support frame having a first width and a second support frame having a second width, the first width being greater than the second width.

9. The device of claim 8 wherein the plurality of support frames includes a third support frame having a third width.

10. A device, comprising:
a plurality of wire bond leads;
a lead frame having a central area that includes an opening, the lead frame including:
 a first, second, third, and fourth tie bar;
 a first ring positioned around the opening; and
 a second ring spaced from the first ring by a first gap, the second ring being separated from the central area by the first ring;
 a third ring spaced from the second ring by a second gap, the second ring being separated from the central area by the first and second rings, the first, second, and third rings being electrically coupled to each other by the first, second, third, and fourth tie bars;
an adhesive tape positioned on the lead frame, the adhesive tape overlapping the central area, the first ring, and the second ring;

a die positioned on the adhesive tape, the die overlapping the central area, the first ring, and the second ring, the third ring being positioned between the die and the plurality of wire bond leads; and a molding compound encapsulating the die, portions of the molding compound filling the opening and the first gap, the portions of the molding compound filling the opening and the first gap being in contact with the adhesive tape.

11. The device of claim 10 wherein the first ring has a first width and the second ring has a second width, the first width being smaller than the second width.

12. The device of claim 10 wherein the third ring is separated from the second ring by a first distance and the second ring is separated from the first ring by a second distance, the first distance being smaller than the second distance.

13. An integrated circuit package, comprising:
a lead frame having a center, including:
    a plurality of concentric components around the center of the lead frame, a first concentric component of the plurality of concentric components being spaced from a second concentric component of the plurality of concentric components by a gap;
    a plurality of tie bars electrically coupling the plurality of concentric components to each other;
a plurality of wire bond leads positioned outside of the plurality of concentric components of the lead frame;
an adhesive tape positioned on the lead frame;
a die positioned on the adhesive tape and having a first surface with a first area, a surface area of the lead frame that is facing the first surface of the die being less than the first area, at least one of the plurality of concentric components being positioned between the die and the plurality of wire bond leads; and
a molding compound encapsulating the die, the gap being filled by a portion of the molding compound that contacts the adhesive tape.

14. The integrated circuit of claim 13, wherein the center of the lead frame includes a die pad, and the die covers the die pad and the first concentric component of the plurality of concentric components.

15. The integrated circuit package of claim 13, wherein the center of lead frame does not include any lead frame material.

16. The integrated circuit package of claim 13, wherein an edge of the die is positioned over the gap.

\* \* \* \* \*

UNITED STATES PATENT AND TRADEMARK OFFICE
CERTIFICATE OF CORRECTION

PATENT NO.         : 9,754,861 B2                                       Page 1 of 1
APPLICATION NO.    : 14/512208
DATED              : September 5, 2017
INVENTOR(S)        : Wing Shenq Wong It is certified that error appears in the above-identified patent and that said Letters Patent is hereby corrected as shown below:

In the Claims

Column 8, Line 27:
"the molding compound filling the at east one gap" should read, --the molding compound filling the at least one gap--.

Signed and Sealed this
Nineteenth Day of February, 2019

Andrei Iancu
*Director of the United States Patent and Trademark Office*